United States Patent [19]
Suzuki et al.

[11] Patent Number: 6,006,736
[45] Date of Patent: Dec. 28, 1999

[54] METHOD AND APPARATUS FOR WASHING SILICON INGOT WITH WATER TO REMOVE PARTICULATE MATTER

[75] Inventors: Yoshihiro Suzuki; Koichi Kato; Keiichi Takami, all of Utsunomiya; Ryoichi Kawamura, Mishima; Takehiro Watanabe, Mishima; Masahiro Kosako, Mishima, all of Japan

[73] Assignee: MEMC Electronic Materials, Inc., St. Peters, Mo.

[21] Appl. No.: 09/000,061

[22] PCT Filed: Jul. 12, 1996

[86] PCT No.: PCT/US96/11627

§ 371 Date: Apr. 21, 1998

§ 102(e) Date: Apr. 21, 1998

[87] PCT Pub. No.: WO97/02905

PCT Pub. Date: Jan. 30, 1997

[30] Foreign Application Priority Data

Jul. 12, 1995 [JP] Japan .................................. 7-201745

[51] Int. Cl.⁶ ........................................................ B28D 1/02

[52] U.S. Cl. ............................ 125/13.02; 134/26; 134/34

[58] Field of Search ................................ 451/65, 73, 54; 125/13.01, 13.02; 134/26, 34, 10, 902, 167 R, 166 R

[56] References Cited

U.S. PATENT DOCUMENTS

| | | | |
|---|---|---|---|
| 4,484,417 | 11/1984 | Klingerman | 51/267 |
| 4,619,081 | 10/1986 | Lipanski | 51/267 |
| 4,941,489 | 7/1990 | Kamimura et al. | 134/95 |
| 4,949,700 | 8/1990 | Ebashi | 125/13.01 |
| 4,997,490 | 3/1991 | Vetter et al. | 134/26 |
| 5,186,192 | 2/1993 | Netsu et al. | 134/68 |
| 5,320,706 | 6/1994 | Blackwell | 134/902 |
| 5,421,905 | 6/1995 | Ueno et al. | 134/25.4 |
| 5,427,644 | 6/1995 | Nagatsuka et al. | 156/344 |
| 5,447,890 | 9/1995 | Kato et al. | 437/249 |
| 5,484,326 | 1/1996 | Hirano et al. | 451/41 |
| 5,545,076 | 8/1996 | Yun et al. | 451/287 |

FOREIGN PATENT DOCUMENTS

| | | | |
|---|---|---|---|
| 0269997 | 8/1988 | European Pat. Off. | |
| 0133634 | 8/1982 | Japan | 125/13.01 |

*Primary Examiner*—Robert A. Rose
*Attorney, Agent, or Firm*—Senniger, Powers, Leavitt & Roedel

[57] ABSTRACT

A method and apparatus for washing a sliced silicon ingot reduces the consumption of detergent used to clean the ingot after it is sliced to define individual semiconductor wafers. The ingot is taken as a unit mounted to a holder after slicing to a pre-washing machine. The machine sprays jets of warm to hot water onto the ingot and holder to flush away dust generated during the slicing procedure which has adhered to the ingot. The water spray removes much of the dust. Thus when the ingot is subsequently washed with detergent, less dust must be removed thereby increasing the effective performance life of a given quantity of detergent.

9 Claims, 6 Drawing Sheets

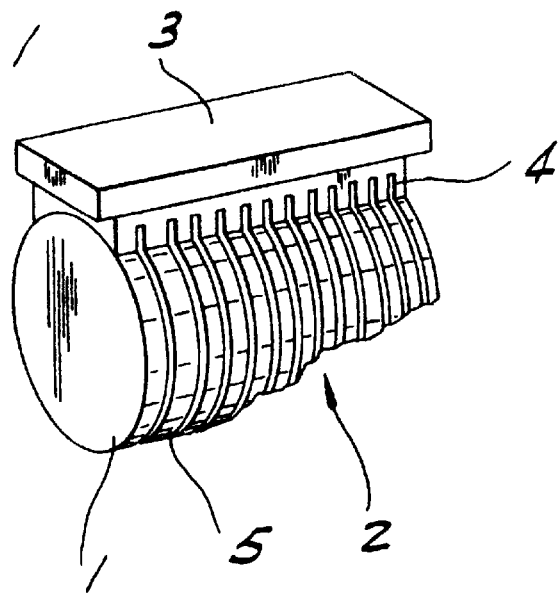
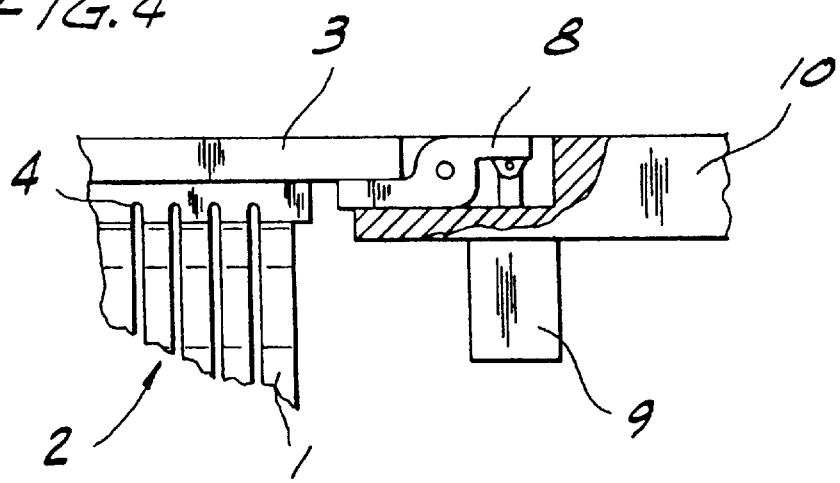
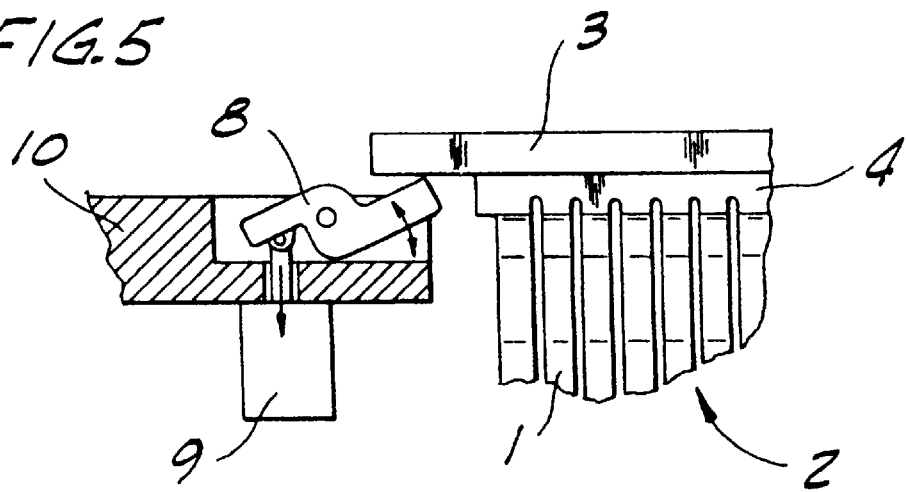

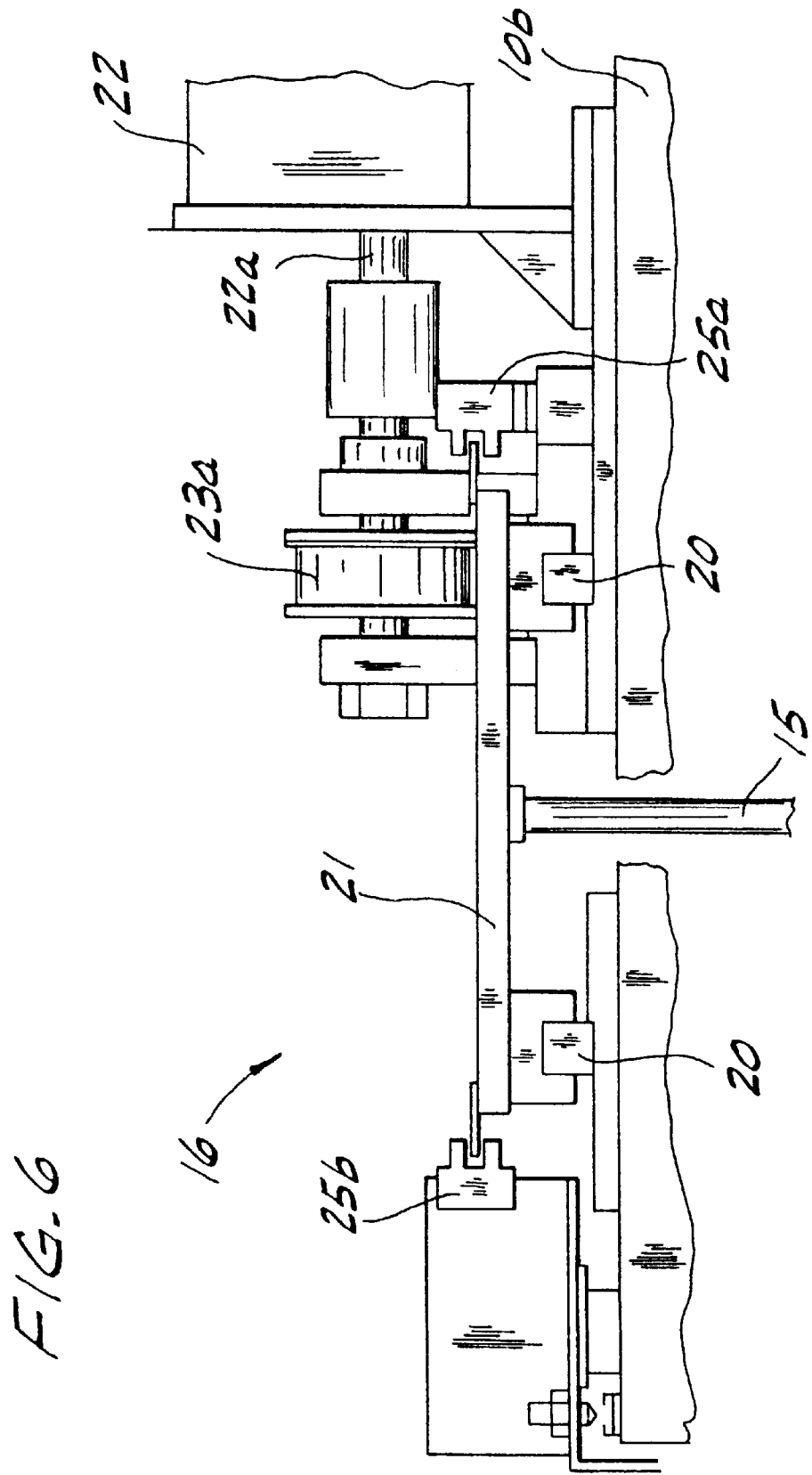

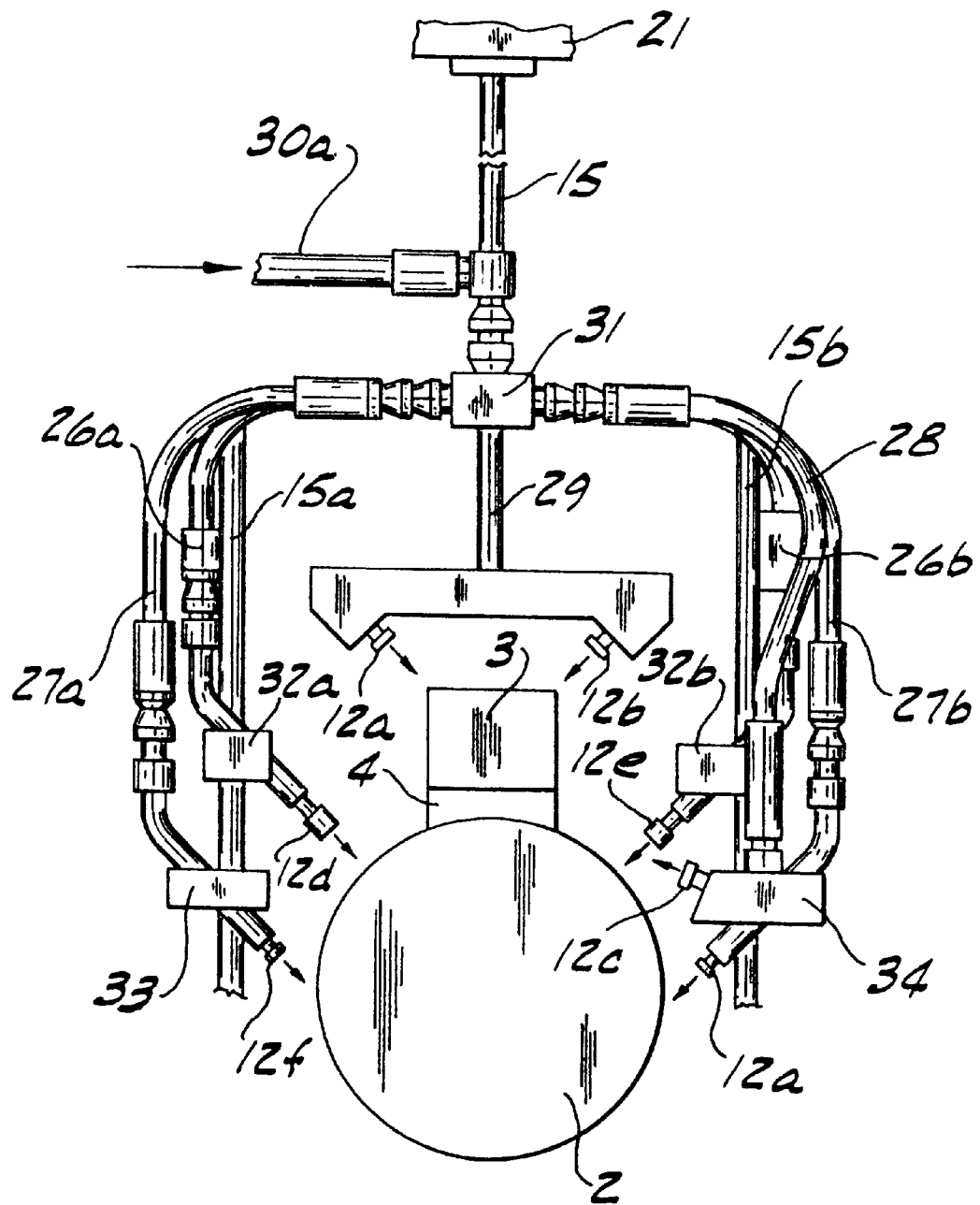

METHOD AND APPARATUS FOR WASHING SILICON INGOT WITH WATER TO REMOVE PARTICULATE MATTER

BACKGROUND OF THE INVENTION

This invention relates to a method and apparatus for washing a sliced silicon ingot, and more particularly to a method for washing a silicon ingot which has already been sliced to form a plurality of silicon wafers.

As is well known in the prior art, a silicon wafer is formed by cutting or slicing a certain thickness such as, for example 880 μm from a silicon ingot having a generally cylindrical shape. In this instance, the silicon ingot is supported by a holder of a cutting machine. Slicing the ingot generates a substantial amount of particulate matter which adheres to the ingot. After the silicon ingot has been sliced, it is immersed in a bath containing a relatively costly detergent. The detergent includes a surfactant and a special oil to remove the particulate matter. The detergent is preferably used to as long as possible because of its substantial cost.

However, the detergent rapidly becomes filled with the particulate matter which results in a loss of chemical activity of the detergent. It will then no longer effectively remove the particulate matter from the ingot and must be replaced with fresh detergent.

In light of the above, it is a principal object of the present invention to provide an improved method and apparatus for washing a sliced silicon ingot for substantially slowing the rate of loss of chemical activity of the detergent.

Another object of the invention is to provide an improved method and apparatus for washing a worked silicon ingot for reducing the consumption of detergent.

Generally, a method for preparing semiconductor wafers from monocrystalline ingots comprises the steps of mounting the ingot on a holder. The ingot is sliced through at closely spaced longitudinal intervals thereby forming slits, each pair of slits defining a semiconductor wafer in the ingot. The sliced ingot is washed with water to remove particulate matter from the ingot which was generated during the step of slicing through the ingot and adhered to the ingot and which accumulates in the slits. Washing the ingot with detergent chemically removes particulate matter remaining following the step of washing the ingot with water. The step of washing the ingot with detergent occurs after said step of washing the ingot with water. The wafers are then separated from the holder for further individual processing of the wafers.

In another aspect of the invention, a apparatus for pre-washing a sliced silicon ingot generally comprises a support for holding the ingot. Nozzles are adapted to deliver jets of water against the ingot for flushing particulate matter from the ingot. A carrying device mounts the nozzles for movement longitudinally back and forth over substantially the full length of the ingot.

BRIEF DESCRIPTION OF THE DRAWINGS

Other objects and features of the invention will become more readily apparent from the following detailed description when read in conjunction with the accompanying drawings, in which:

FIG. 1 is a schematic, fragmentary perspective view showing a sliced silicon ingot attached to a holder by a carbon block;

FIG. 4 is an enlarged fragmentary elevation of the pre-washing machine of FIG. 2 showing a holder arm supporting the ingot at the right end of sliced silicon ingot;

FIG. 5 is an enlarged fragmentary elevation of the pre-washing machine of FIG. 2 showing the holder arm supporting the ingot at the left end of the ingot in a raised position;

FIG. 6 is a fragmentary right side elevation of the pre-washing machine of FIG. 3 illustrating the mounting of a support arm of the pre-washing machine;

FIG. 7 is an elevation showing a plurality of nozzles mounted on the support arm for spraying the ingot.

DETAILED DESCRIPTION OF PREFERRED EMBODIMENTS

Figure 2:
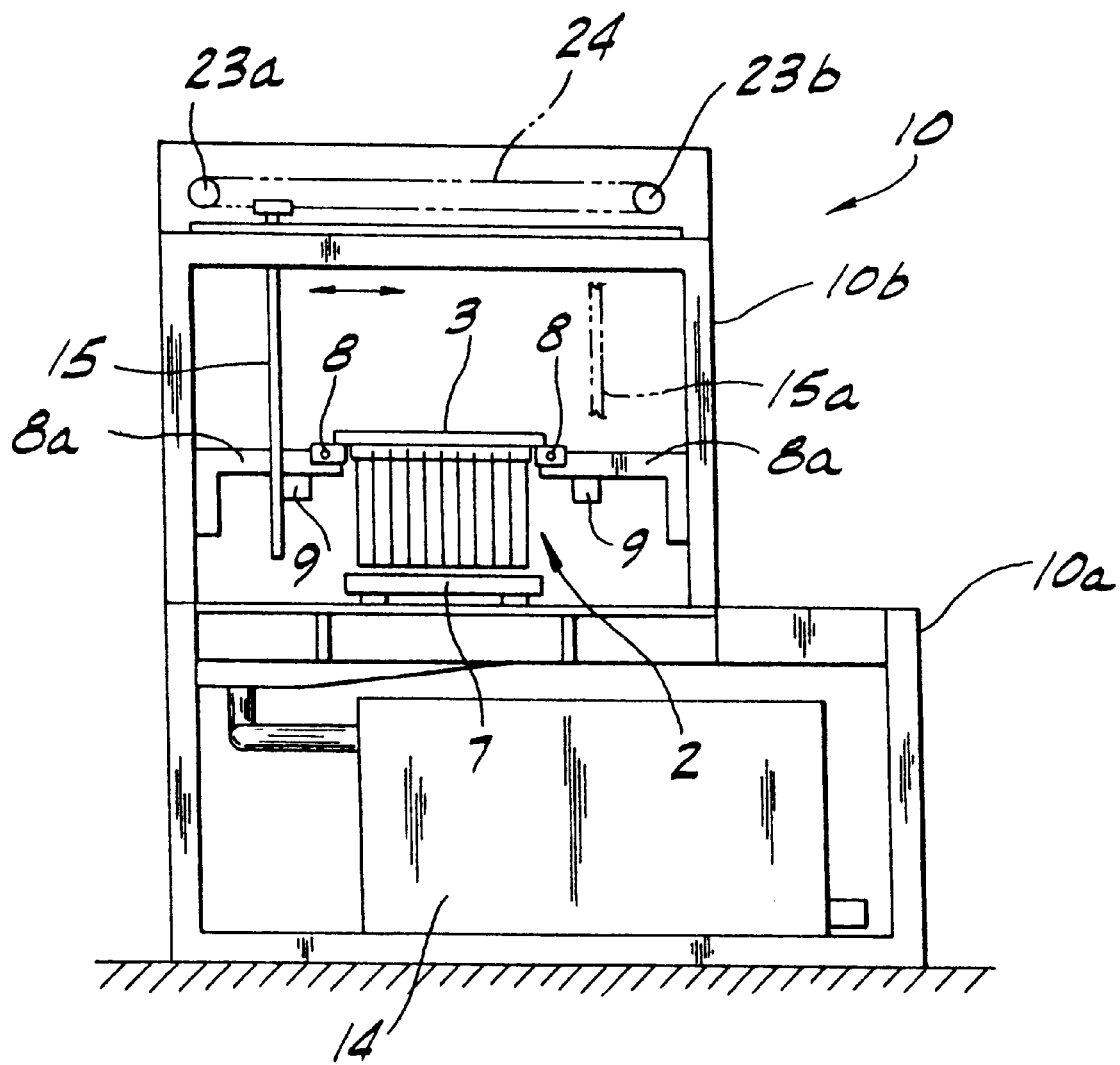
FIG. 2 is a schematic front elevation showing a pre-washing machine to be used for carrying out the method of the present invention.

As shown in FIG. 1, a plurality of silicon wafers 1 are sliced or cut from a generally cylindrical silicon ingot 2 by a suitable cutting mechanism, such as a wire cutting tool or internal diameter saw (not shown). The ingot 2 is attached to a carbon block 4 which is adhered to a holder 3 made of suitable material such as stainless steel. The cutting mechanism cuts into the carbon block 4 when the ingot 2 is sliced to form the wafers 1, but the holder 3 is protected from damage by the presence of the carbon block so that it may be reused.

When manufacturing the silicon wafers 1 out of the ingot 2, a plurality very small, closely spaced slits 5 are formed in the ingot 2 and the carbon block 4. The drawings exaggerate the thickness of the wafers 1 so that the slits 5 may be more clearly seen. Particulate matter (i.e., silicon dust) is generated by the cutting of the slits. An abrasive and cutting oil which are applied to the ingot 2 while it is being sliced by the cutting mechanism remain on the ingot after slicing and also operate to adhere the particulate matter to the ingot. In practice it has been found that substantial amounts of particulate matter accumulate in the slits 5 during slicing.

In the past, the sliced silicon ingot 2 is transferred directly from the cutting mechanism to a stage for washing with a detergent containing surfactants to remove the particulate matter, abrasives and oil. Because of the great quantity of particulate matter on the ingot 2, the detergent would be quickly affected by the particulate matter so that the expensive detergent loses its chemical activity (i.e., the detergents become so choked with particulate matter that the surfactants in the detergents lose their ability to remove additional particulate matter, abrasives and oil). The loss of performance by the detergent is so rapid that it must be frequently replaced in order to make sure that the ingots are adequately cleaned of particulate matter, abrasives and oil. After cleaning, the wafers 1 are separated from the carbon block and additional processing of the wafers is carried out in a manner well understood by those of ordinary skill in the art.

According to the present invention, therefore, the worked silicon ingot 2 is first forwarded from the cutting mechanism by a wheeled carriage 7 to a pre-washing machine (generally indicated at 10) in which the sliced ingot 2 is sprayed with warm to hot water, before the ingot 2 is treated with the detergent. The pre-washing machine 10 has a frame including a lower frame portion 10a and an upper frame portion 10b mounted on the lower frame portion.

Figure 3:
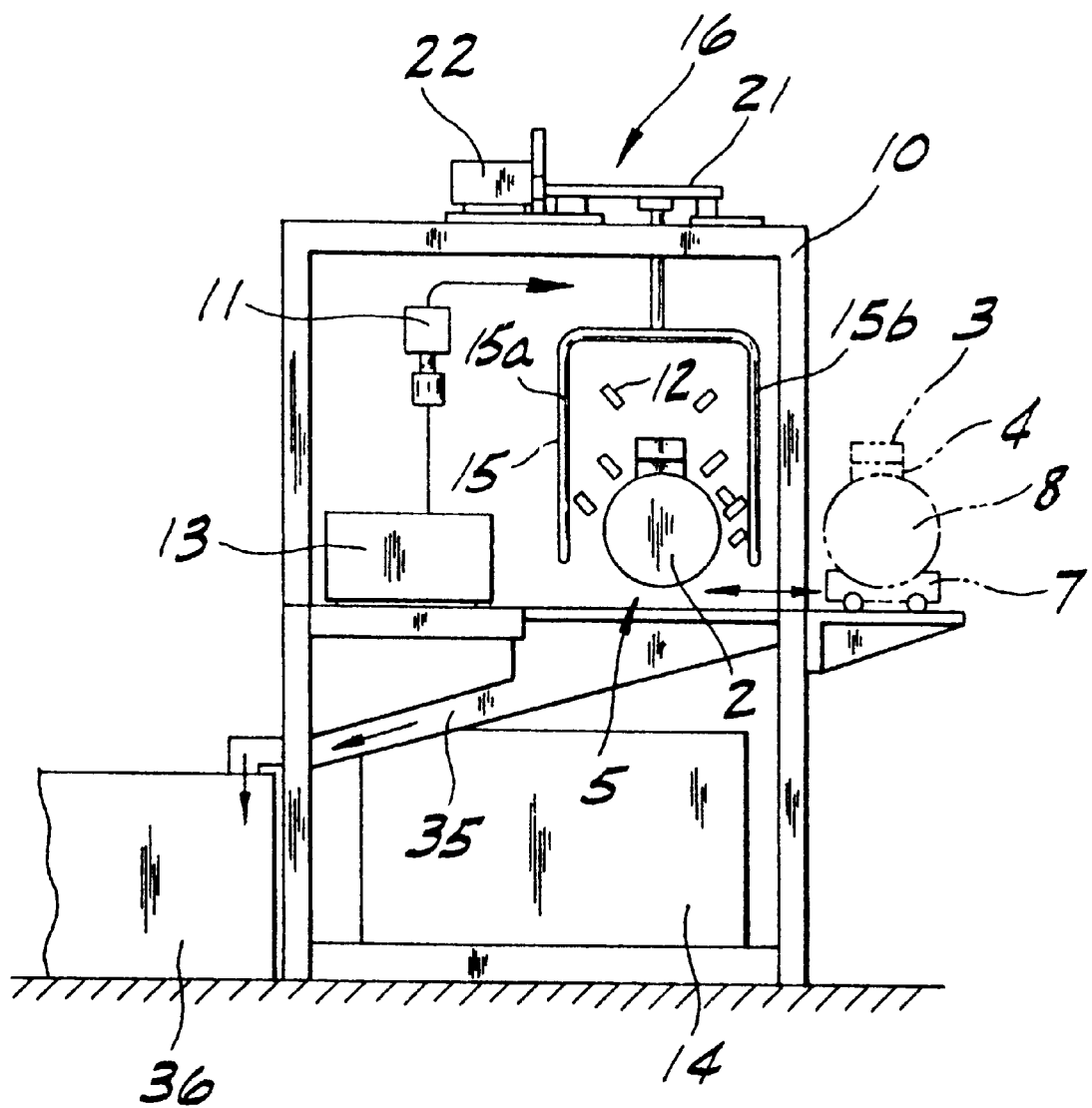
FIG. 3 is a right side elevation of the pre-washing machine of FIG. 2.

As shown in FIGS. 2 and 3, the pre-washing machine 10 has a water spraying section S having a plurality of nozzles 12 where the sliced silicon ingot 2 is held by a pair of holder arms 8. The holder arms 8 are formed as shown in FIGS. 4 and 5, and pivotally mounted on respective brackets 8a attached to the upper frame portion 10b of the pre-washing machine 10. Together the holder arms 8 and brackets 8a constitute "supports" in the preferred embodiment. Air-cylinders 9 mounted on the brackets 8a are operable to pivot the holder arms between a lowered position (as shown in FIG. 4) and a raised position (as shown in FIG. 5).

After slicing by the cutting mechanism, the ingot 2 still mounted on the holder 3 and by the carbon block 4 is placed on the carriage 7 which is rolled into the spraying section S of the pre-washing machine. In the spraying section S, the ends of the holder 3 overlie the holder arms 8, as is illustrated in FIG. 4. The air cylinders 9 are then activated to lift up the holder 3 (and the ingot 2 supported by the older), as is illustrated in FIG. 5. The carriage 7 is returned back out of the spraying section, and the sliced silicon ingot 2 is washed by the warm water sprayed from the nozzles 12 mounted on an supporting arm 15.

Figure 8:
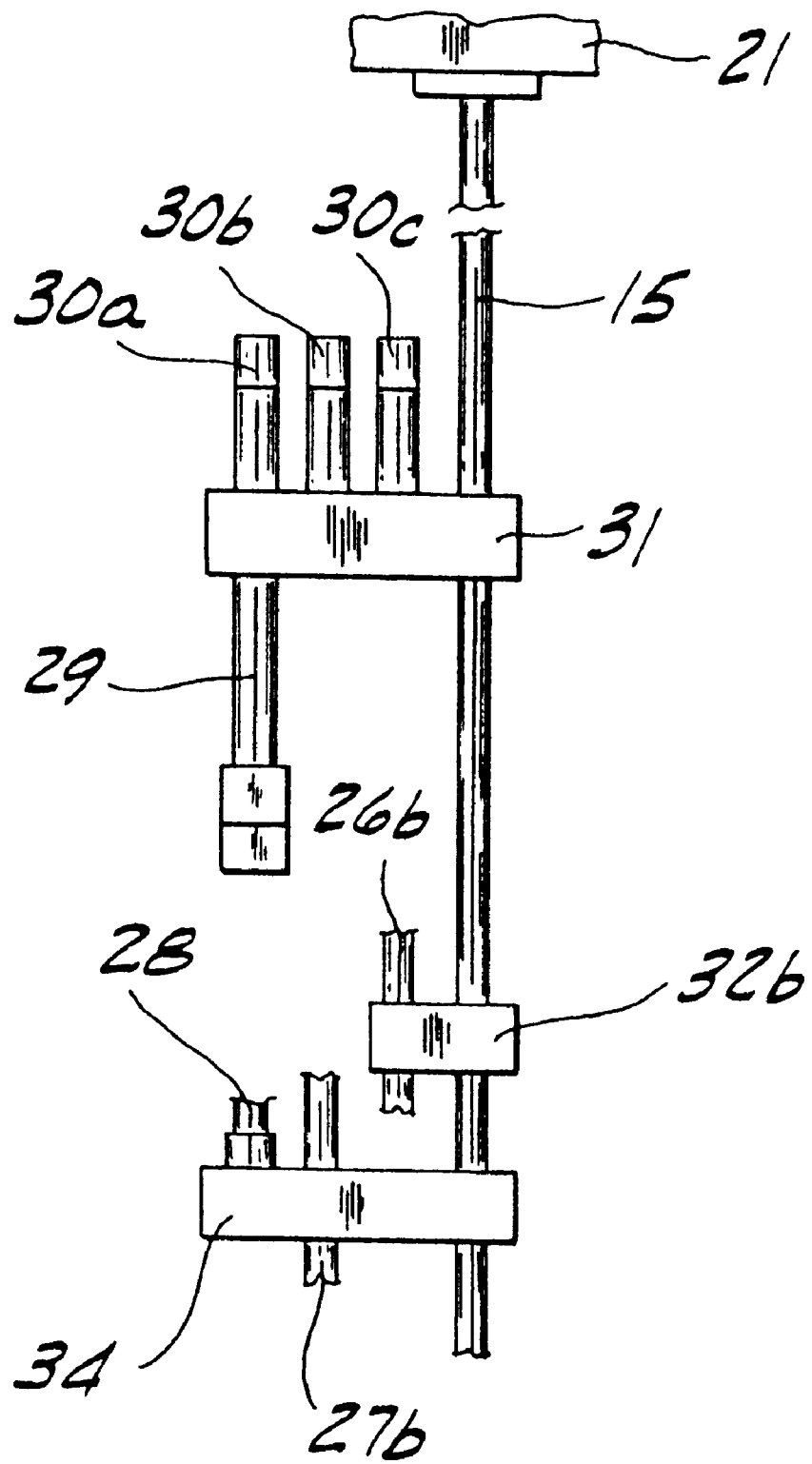
FIG. 8 is a fragmentary right side elevation of the support arm of FIG. 7.

Referring now to FIGS. 7 and 8, the warm water at the temperature of about 60° C. is supplied to through conduits 30a, 30b, 30c to the nozzles 12a–g mounted on a forked member or supporting arm 15. The supporting arm 15 has prongs 15a, 15b which are spaced apart a distance selected to receive the diameter of the ingot 2 between them. Water in the range of at least about room temperature, up to about 70° C. is preferable with the water temperature of about 60° C. being most preferred. Water above 70° C. tends to break down the bond between the ingot 2 and the carbon block 4. Of course, with superior adhesives, higher water temperatures could be used. The water is supplied by means of a high pressure pump 13 from a tank 14 which is provided with a heater, thermometer, leveling instrument and other equipment. As is illustrated in FIG. 3, the water passes from the pump 13 through a valve 11 to the nozzles 12a–g. The valve 11 is selectively operated by a controller (not shown) to permit water to flow to the nozzles 12a–g or to shut off the flow of water to the nozzles.

More particularly with reference to FIGS. 7 and 8, water flows from valve 11 through the three conduits 30a, 30b, 30c to the supporting are 15. At the supporting arm 15, conduit 30a is connected to conduits 28 and 29, conduit 30b is connected to conduits 27a and 27b, and conduit 30c is connected to conduits 26a, 26b. Conduits 26a, 26b, 27a, 27b and 28 are connected to nozzles 12a–e, respectively. Conduit 29 feeds both nozzles 12a and 12b. The conduits 26a, 26b, 27a, 27b, 28 and 29 are mounted on the supporting arm 15 by connecting means 31, 32a, 32b, 33 and 34. The nozzles 12a, 12b and 12c are particularly directed for washing the holder 3 and carbon block 4. The nozzles 12a, 12b and 12d–g are preferably arranged at angles of between about 60° and 90° toward the horizontal from a downward direction. The nozzle 12c is angled upwardly from the horizontal to spray the underside of the holder 3 and the carbon block 4. The pump 13 preferably delivers water to each nozzle 12a–g at a pressure of in the range of about 10–30 kg/cm² and each of the nozzles delivers water to the ingot 2 in jets at a rate in the range of about 5–10 liters/minute. The spray angle of the jets from the nozzles 12a–g is preferably selected to be between 30° and 120°. The jets penetrate the slits 5 and flush away much of the particulate matter from the ingot.

The nozzles 12a–g mounted on the supporting arm 15 are reciprocated by a carrying device 16 between the position of the arm 15 denoted by a solid line and the position of the arm 15a denoted by a dotted line in FIG. 2. In the preferred embodiment, the supporting arm 15 carries the nozzles 12a–g over the entire length of the ingot 2 three to four times over a period of about 10 minutes.

As shown in FIG. 6, the carrying device 16 has a slide base 21 (broadly, "mounting means") to which the supporting arm 15 is mounted. The slide base rides on a pair of rails 20 arranged on top of the upper frame portion 10a to carry the supporting arm 15 and nozzles 12a–g mounted thereon between the positions illustrated in FIG. 2. Movement of the slide base 21 is actuated by a reversible electric motor 22 having a shaft 22a on which is mounted a drive pulley 23a. A belt 24 extends in a circuit around the drive pulley 23a and a idler pulley 23b (FIG. 2). The slide base 21 is attached to the lower reach of the belt 24 so that by selectively running the motor 22 in opposite directions, the slide base and supporting arm 15 are moved back and forth across the length of the ingot 2. The position of the slide base 21 along the length of the ingot 2 is detected by sensors 25a, 25b so that the position of the supporting arm 15 is known, and may be controlled by a controller (not shown).

As illustrated in FIG. 3, a drip pan 35 is positioned under the spraying section S of the pre-washing machine 10 to catch water falling from the ingot 2, and the particulate matter, abrasives and oil entrained with the water. The waste water is funneled by the drip pan 35 to a waste water tank 36.

Then the sliced and pre-washed silicon ingot 2 supported by the holder 3 is transferred to a conventional stage for washing with the more costly detergent containing surfactants and special oil. It is believed that by pre-washing, the detergent may be used to wash at least about three times as many wafers than in the prior method in which no pre-washing step was present.

It is further envisioned that the same pre-washing method and apparatus (machine 10) may be used to clean the ingot 2 after it is turned to give it a more precisely right cylindrical shape prior to slicing.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A method for preparing semiconductor wafers from monocrystalline ingots comprising the steps of:
   mounting the ingot on a holder;
   slicing through the ingot at closely spaced longitudinal intervals thereby forming slits, each pair of slits defining a semiconductor wafer in the ingot;
   washing the ingot with water to remove particulate matter from the ingot which was generated during said step of slicing through the ingot and adhered to the ingot and which accumulates in the slits;
   washing the ingot with detergent to chemically remove particulate matter remaining following said step of washing the ingot with water, said step of washing the ingot with detergent occurring after said step of washing the ingot with water; and
   separating the wafers from the holder for further individual processing of the wafers.

2. A method as set forth in claim 1 wherein said step of washing the semiconductor wafers with water occurs prior to said step of separating of the wafers.

3. A method as set forth in claim 2 wherein said step of washing the semiconductor wafers with detergent occurs prior to said step of separating of the wafers.

4. A method as set forth in claim 1 further comprising the step of heating the water prior to use in said step of washing the semiconductor wafers with water.

5. A method as set forth in claim 4 wherein said step of heating the water comprises heating the water to a temperature between room temperature and about 70° C.

6. A method as set forth in claim 5 wherein step of heating the water comprises heating the water to a temperature of about 60° C.

7. A method as set forth in claim 1 wherein the step of washing the semiconductor wafers with water comprises spraying at least one jet of water onto the semiconductor wafers to flush away the particulate matter on the semiconductor wafers.

8. A method as set forth in claim 7 wherein the step of washing the semiconductor wafers further comprises the step of reciprocating the jet of water generally longitudinally of the ingot.

9. A method as set forth in claim 8 wherein the step of reciprocating the jet comprises moving the jet over substantially the full length of each ingot at least 3 times and for a period of at least about 10 minutes.

* * * * *